(12) United States Patent
Lee

(10) Patent No.: US 6,391,697 B2
(45) Date of Patent: May 21, 2002

(54) METHOD FOR THE FORMATION OF GATE ELECTRODE OF SEMICONDUCTOR DEVICE USING A DIFFERENCE IN POLISHING SELECTION RATIO BETWEEN POLYMER AND OXIDE FILM

(75) Inventor: Sang-Ick Lee, Ichon-shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/855,849

(22) Filed: May 16, 2001

(30) Foreign Application Priority Data

May 19, 2000 (KR) .......................... 2000-26895

(51) Int. Cl.[7] ............................. H10L 21/336

(52) U.S. Cl. .................. 438/197; 438/303; 438/306

(58) Field of Search ................. 438/197, 183, 438/303–306, 683–686, 691, 692, 700; 257/368, 408

(56) References Cited

U.S. PATENT DOCUMENTS 6,033,963 A * 3/2000 Huang et al. ............... 438/303

* cited by examiner

*Primary Examiner*—David Nelms
*Assistant Examiner*—Dung A Le
(74) *Attorney, Agent, or Firm*—Jacobson Holman, PLLC (57) ABSTRACT

A method for the formation of a gate electrode with a uniform thickness in the semiconductor device by using a difference in polishing selection ratio between a polymer and an oxide film. The method includes steps of depositing a polymer layer on a semiconductor substrate; selectively etching the polymer layer to form a patterned polymer; forming an insulating oxide film for planarization; applying a CMP process to the insulating oxide film; removing the patterned polymer to define an opening with its bottom exposed to the substrate; forming a gate insulating film on the substrate within the opening; depositing an electrically conducting film to bury the opening; applying the CMP process to the electrically conducting film to allow it to remain only within the opening; removing a portion of the electrically conducting film formed within the opening by etching; depositing a mask nitride film to bury the top of the electrically conducting film; and applying the CMP process to the mask nitride film until the insulating oxide film is exposed.

11 Claims, 7 Drawing Sheets

METHOD FOR THE FORMATION OF GATE ELECTRODE OF SEMICONDUCTOR DEVICE USING A DIFFERENCE IN POLISHING SELECTION RATIO BETWEEN POLYMER AND OXIDE FILM

FIELD OF THE INVENTION

The present invention relates to a semiconductor device and, more particularly, to a method for the formation of a gate electrode with a uniform thickness in the semiconductor device through the use of a difference in polishing selection ratio between a polymer and an oxide film.

DESCRIPTION OF THE PRIOR ART

There are shown in FIGS. 1A to 1E sectional views setting forth a conventional gate formation method using a damascene process.

Figure 1A:
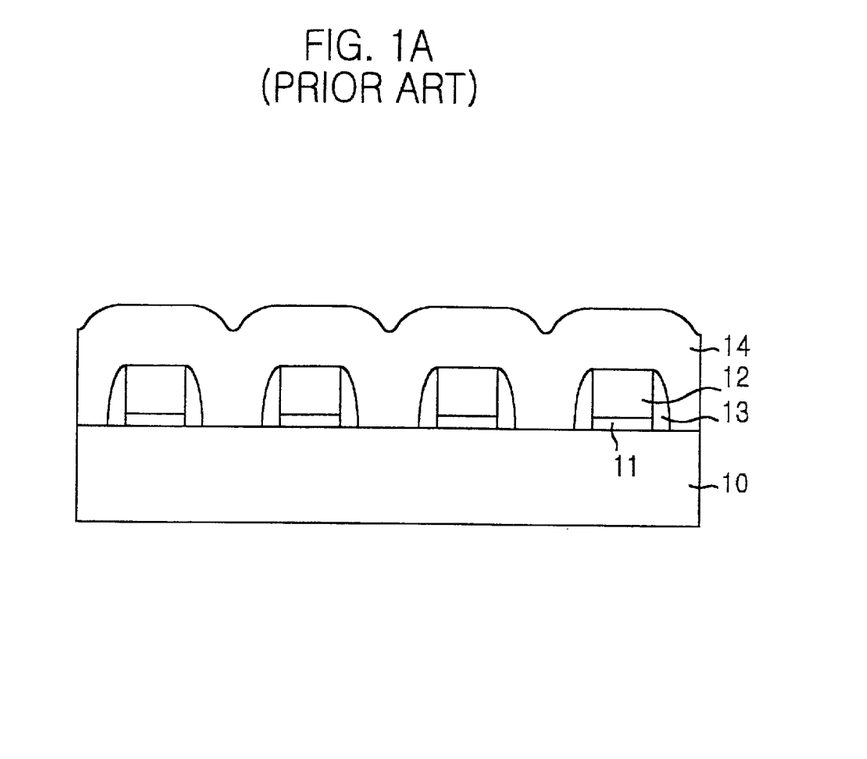
FIGS. 1A to 1E are sectional views setting forth a conventional gate formation method using a damascene process.

The structure shown in FIG. 1A is obtained by steps of depositing a pad oxide film 11 followed by a polysilicon film 12 on a semiconductor substrate 10; selectively etching the polysilicon film 12 and the pad oxide film 11 to pattern the polysilicon film 12 for acting as a dummy pattern; depositing an insulating film such as a nitride film or an oxide film on top of the patterned polysilicon film 12; etching the whole surface obtained so as to form an insulating film spacer 13 at a sidewall of the patterned polysilicon film 12; depositing an insulating oxide film 14 for planarization on the polysilicon film 12 and the insulating film spacer 13; and heat-treating the insulating oxide film 14.

Figure 1B:
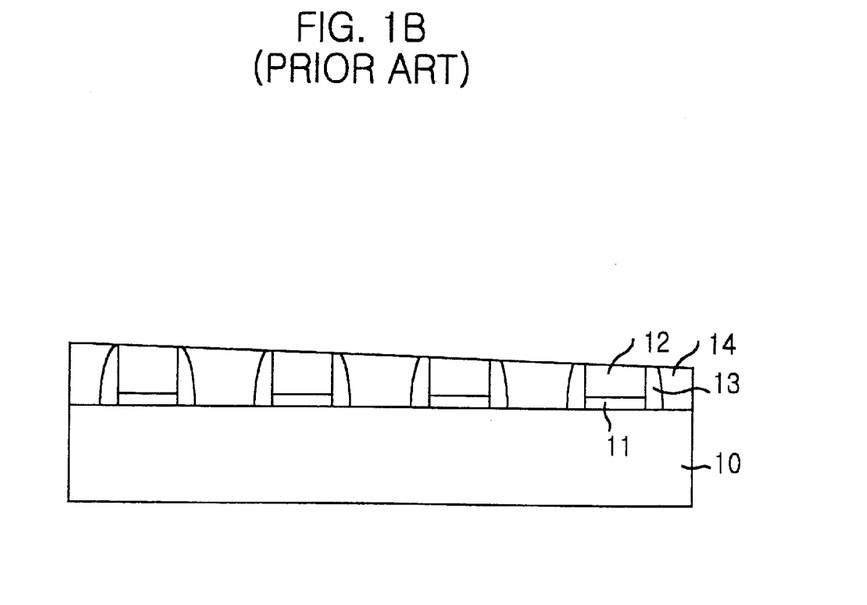

FIG. 1B is a sectional view showing a structure obtained by applying a chemical-mechanical polishing (CMP) process to the insulating oxide film 14 using a slurry for oxide film until the patterned polysilicon film 12 is exposed. If the chemical-mechanical polishing is applied to the insulating oxide film 14 using a typical oxide film slurry having a very small polishing selection ratio between the polysilicon film 12 and the insulating oxide film 14, when the patterned polysilicon film 12 is exposed, a chemical-mechanical polishing unevenness depending on a wafer region is induced, resulting in a position dependent thickness of the patterned polysilicon film 12.

Figure 1C:
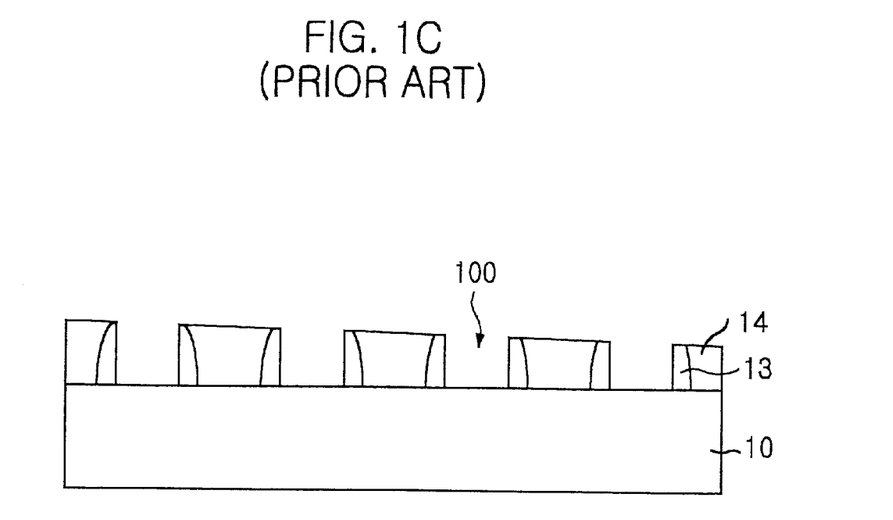

Then, the polysilicon film 12 and the pad oxide film 11 are removed. As a result, the insulating film spacer 13 is exposed at its side wall and an opening 100 with a wafer-region-dependent depth is formed as shown in FIG. 1C.

Figure 1D:
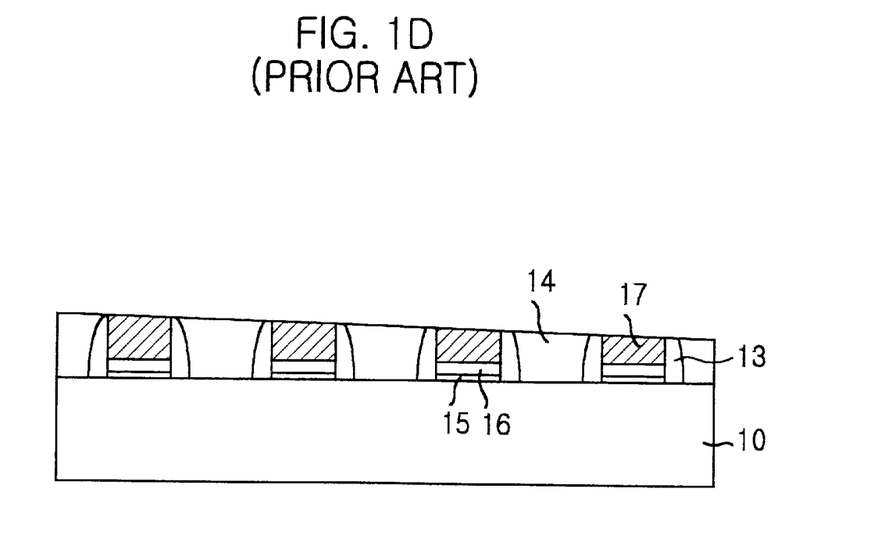

FIG. 1D is a sectional view showing that a gate oxide film 15, a barrier metal film 16 and a tungsten film 17 are sequentially buried within the opening 100, after which the chemical-mechanical polishing process is applied to the tungsten film 17 until the insulating oxide film 14 is exposed. The unevenness of the chemical-mechanical polishing causes the thickness of the tungsten film 17 buried within the opening 100 to be variable.

Figure 1E:
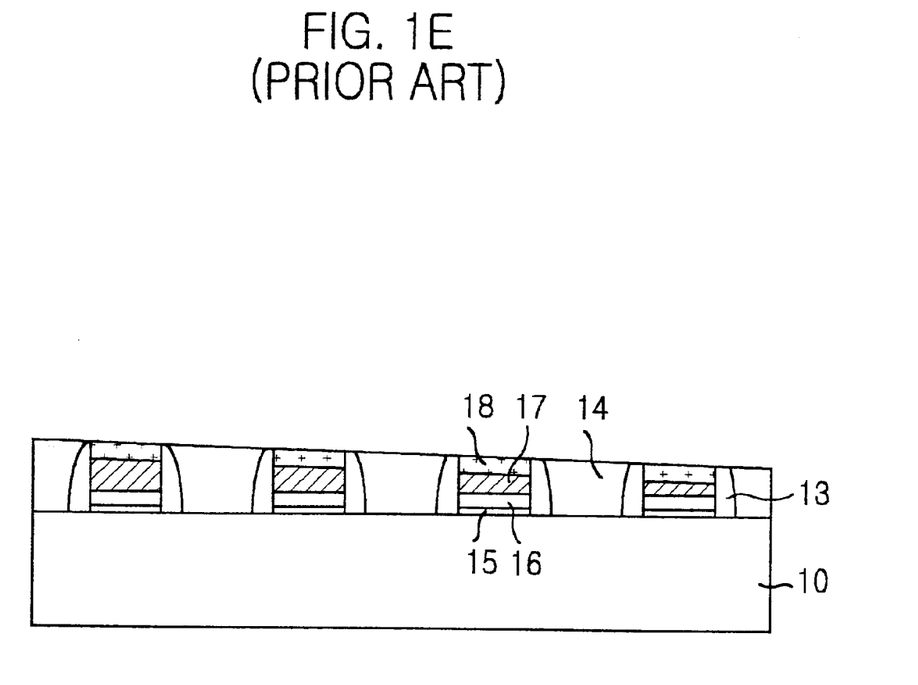

FIG. 1E is a sectional view showing a structure obtained by etching a portion of the tungsten film 17 in the opening; depositing a mask nitride film 18 on the remaining tungsten film; and forming the gate electrode by polishing the mask nitride film 18 until the insulating oxide film 14 is exposed.

As shown in FIG. 1E, the elevation of the tungsten film 17 making the gate electrode is dependent upon the wafer region because while performing the chemical-mechanical polishing process on the insulating oxide film 14 using a typical slurry for oxide film polishing, with the polysilicon film 12 buried within the opening, an uneven polishing is applied to the polysilicon film 12, resulting in the removal of the polysilicon film 12 but allowing the tungsten film 17 buried within the opening to have an uneven thickness along the wafer region.

As a result, the conventional damascene gate formation method discussed above suffers from a drawback in that the elevation of the gate is dependent upon the wafer region, rendering electrical properties of the gate unstable.

To overcome the foregoing problem, a method is proposed in which the thickness of the insulating film spacer and the oxide film is increased, but this method creates unnecessary burden to increase thickness of the spacer and film to be polished.

SUMMARY OF THE INVENTION

It is, therefore, a primary object of the present invention to provide a method for the formation of a gate electrode with a uniform thickness in the semiconductor device through the use of a difference in polishing selection ratio between a polymer and an oxide film.

In accordance with a preferred embodiment of the present invention, there is provided a method for the formation of a gate electrode of a semiconductor device, comprising steps of depositing a polymer layer on a semiconductor substrate; selectively etching the polymer layer to form a patterned polymer; forming an insulating oxide film for planarization on a structure obtained at the above step; applying a chemical-mechanical polishing (CMP) process to the insulating oxide film, wherein the patterned polymer is used as a polishing stop layer; removing the patterned polymer to define an opening with its bottom defined by an exposed portion of the semiconductor substrate; forming a gate insulating film on the exposed semiconductor substrate within the opening; depositing an electrically conducting film on a structure obtained at the above step to bury the opening; applying the CMP process to the electrically conducting film to allow the electrically conducting film to remain only within the opening, wherein the insulating oxide film is used as a polishing stop layer; removing a portion of the electrically conducting film formed within the opening by etching; depositing a mask nitride film on a structure obtained at the above step to bury the top of the electrically conducting film; and applying the CMP process to the mask nitride film until the insulating oxide film is exposed.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 2A:
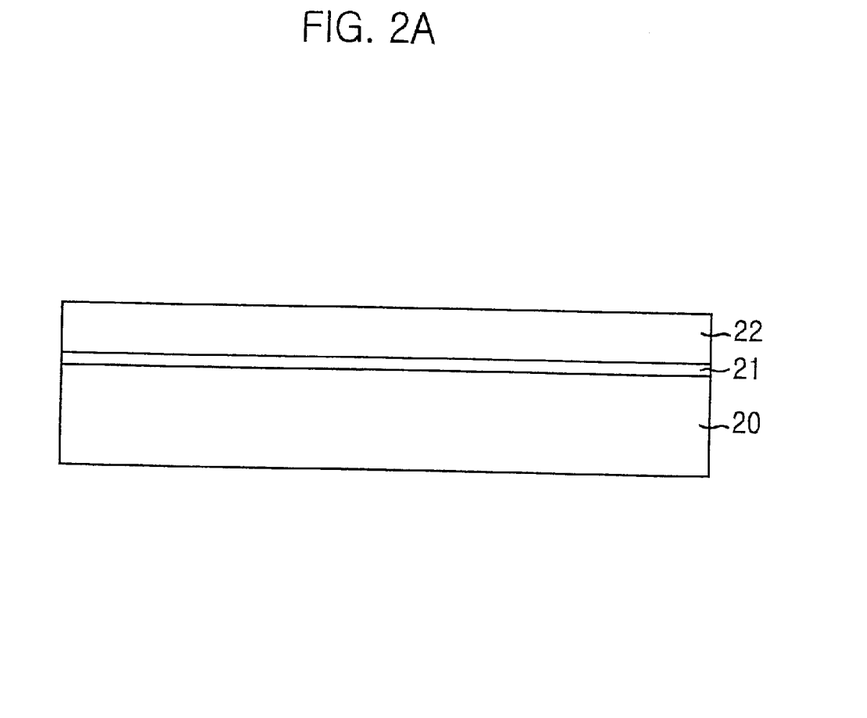
FIGS. 2A to 2G are sectional views setting forth a method for the formation of a gate electrode in accordance with a preferred embodiment of the present invention.

As shown in FIG. 2A, a pad oxide film 21 followed by a polymer 22 are deposited on a semiconductor substrate 20.

The pad oxide film 21 with a thickness of 40 Å to 100 Å is formed using a low pressure chemical vapor deposition (hereinafter referred to as LPCVD) or a plasma enhanced chemical vapor deposition (hereinafter referred to as PECVD) under a temperature ranging from 400° C. to 1300° C. The polymer 22 is formed by a Silk (silicon low K polymer—K is dielectric constant), Flare (fluorinated polyaryl-ether) or BCB (benzocyclobutene).

The preceding step is then followed by baking the structure shown in FIG. 2A at a temperature ranging from 90° C. to 350° C. for more than one minute. The baking process includes a sequence of temperatures ranging from 90° C. to 150° C., from 200° C. to 250° C., and from 300° C. to 350° C. After the baking process, a curing process is applied at a temperature ranging from 300° C. to 500° C. for 30 to 60 minutes. The curing process includes a sequence of temperatures ranging from 400° C. to 500° C., from 350° C. to 450° C., and from 300° C. to 400° C. During the curing process, a concentration of oxygen should be set to be less than several hundred PPM. On the one side, a hard mask layer including a SiN, $SiO_2$ and SiON may be formed on the polymer 22. In this case, the hard mask layer with a thickness of 100 Å to 1000 Å is formed by the PECVD at a temperature ranging from 200° C. to 550° C.

Figure 2B:
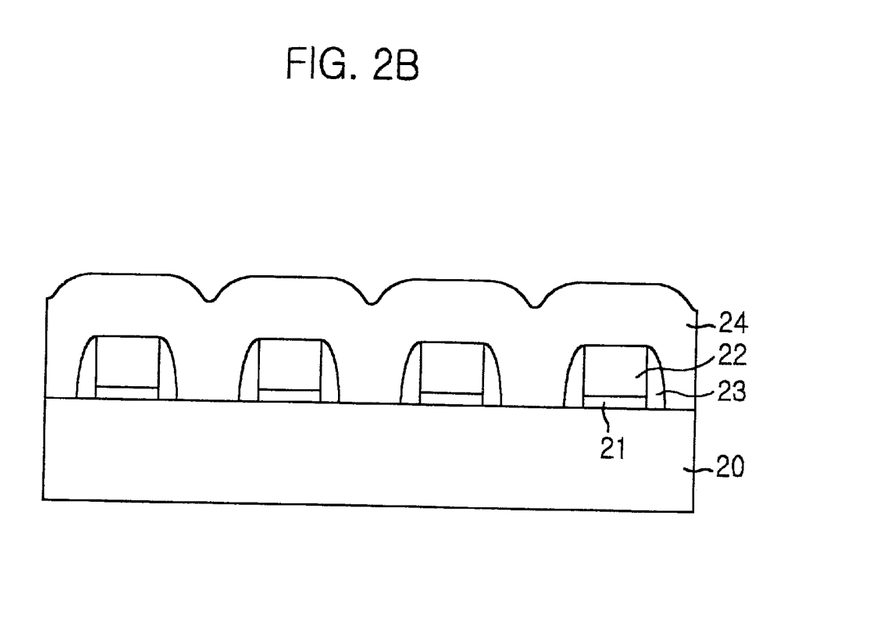

Subsequently, as shown in FIG. 2B, the pad oxide film 21 and the polymer 22 are selectively etched to form a patterned polymer functioning as a dummy pattern. In an ensuing step, an impurity is ion-implanted within the semiconductor substrate 20 to form a source-drain path (not shown). After that, an insulating film including a nitride film or an oxide film is deposited on a structure resulting from the above steps. Next, an etching is applied to the whole surface to form an insulating film spacer 23 at a sidewall of the patterned polymer 22. In a subsequent step, a source-drain (not shown) of high concentration is formed by the impurity ion implantation process. Depositing an insulating oxide film 24 for planarization on the whole structure and heat-treating the insulating oxide film 14 then follow the preceding steps.

The nitride film or the oxide film with a thickness ranging from 100 Å to 1000 Å is formed by using the LPCVD or PECVD process under a temperature ranging from 300° C. to 1300° C. The insulating oxide film 24 is formed by any one of a borophosphor silicate glass (BPSG), phosphor silicate glass (PSG), fluorinated silicate glass (FSG), tetra-ethyl orthosilicate (TEOS) or SiH4, each being formed by the PECVD process; or PSG or undoped silicate glass (USG) each being formed by a plasma of high density and advanced planarization layer (APL), at a thickness ranging from 3000☐ to 10000☐. After the formation of the insulating oxide film 24, a heat treatment is applied according to a film type at a temperature ranging from 300° C. to 1000° C.

Figure 2C:
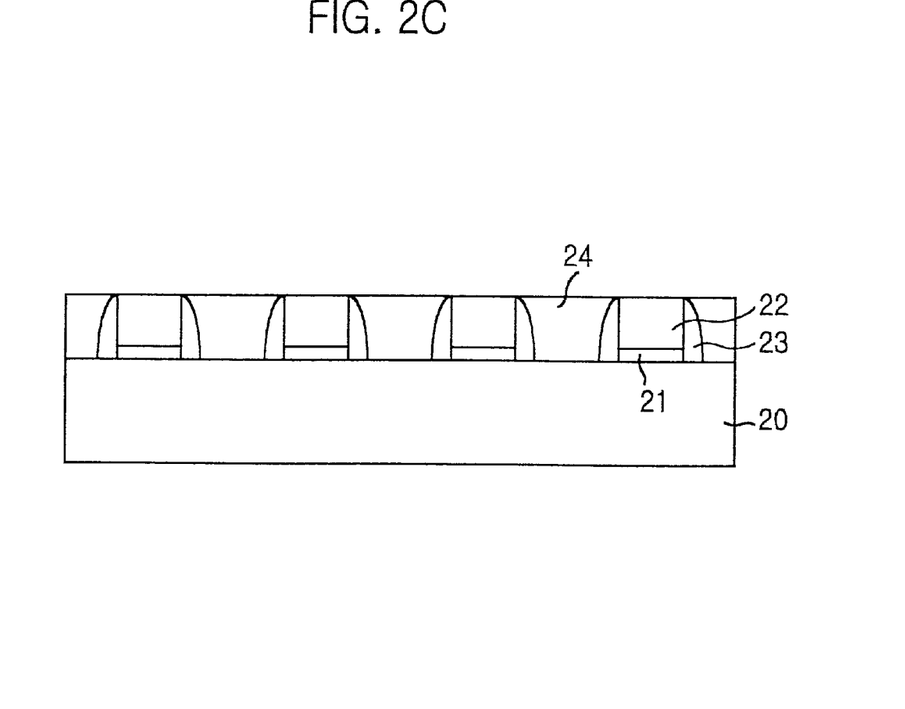

In a subsequent step, the chemical-mechanical polishing process is applied to the insulating oxide film 24 using the slurry for oxide film polishing as shown in FIG. 2C. In this case, the patterned polymer is used as a polishing stop layer.

A slurry of $SiO_2$, $CeO_2$, $Al_2O_3$ or $ZrO_2$ series, with a size ranging from 10 nm to 500 nm, is utilized as the slurry for oxide film polishing in the chemical-mechanical polishing process. The slurry has a hydrogen ion concentration (pH) ranging from 3 to 12 mol/L, and a concentration of organic material in the slurry should be included in a range of 0.01 to 5 wt % by weight. The slurry for oxide film polishing has a high polishing selection ratio of the oxide film to the polymer 22, enhancing a uniformity of the chemical-mechanical polishing.

Figure 2D:
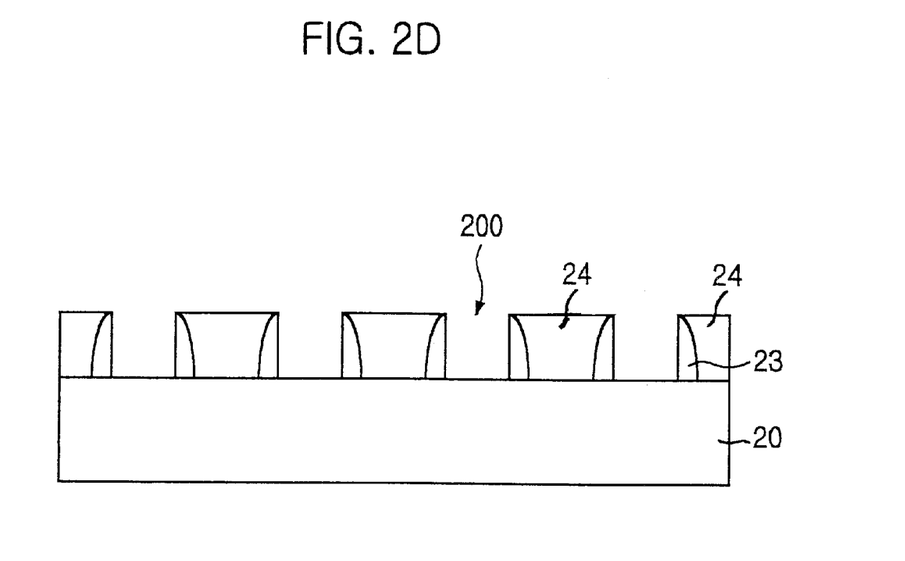

The preceding step is then followed by removing the polymer 22 and the pad oxide film 21 as shown in FIG. 2D. As shown, an opening 200 with its sidewall exposed to the insulating film spacer 23 and its bottom exposed to the semiconductor substrate 20 is defined. The polymer 22 is removed by a plasma scheme using a mixed gas of $O_2$ and Ar or $O_2$ and $N_2$, or a wet etching.

As mentioned above, the uniform chemical-mechanical polishing for the insulating oxide film 24 allows the opening 200 with a uniform depth to be defined on the wafer region.

Figure 2E:
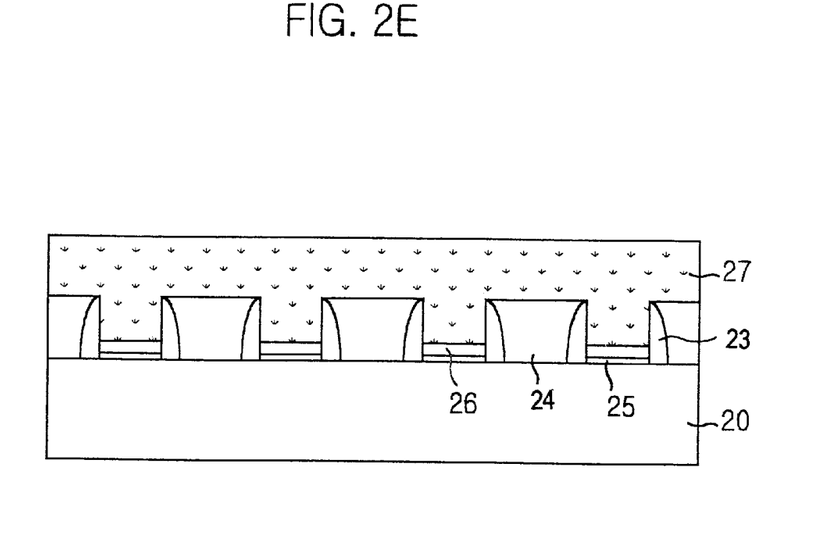

Subsequently, as shown in FIG. 2E, a gate insulating film 25 made of a thermal oxide film, high temperature oxide film, $Al_2O_3$ or $Ta_2O_3$, within a range of 40 Å to 100 Å in thickness, is formed within the opening 200. A barrier metal film 26 is formed on the gate insulating film 25 by depositing a Ti, TiN, TiAlN, TiSiN, TaN, WN or $TiSi_2$ material with a thickness ranging from 50 Å to 800 Å on the gate insulating film 25, through the use of a physical vapor deposition such as sputtering, a chemical vapor deposition or an electroplating. Then, a metal film 27 to be used as a gate electrode is formed on the barrier metal film 26 and the insulating oxide film 24.

The metal film 27 is formed by depositing tungsten(W), copper (Cu) and/or the like with a thickness ranging from 2000 Å to 5000 Å on the barrier metal film 26 using the physical vapor deposition such as sputtering or the chemical vapor deposition, at a normal temperature or 1000° C. On the other hand, after the formation of the barrier metal film 26, a heat treatment may be selectively applied at a temperature ranging from 400° C. to 800° C. in a $N_2$ ambient according to a film type.

Figure 2F:
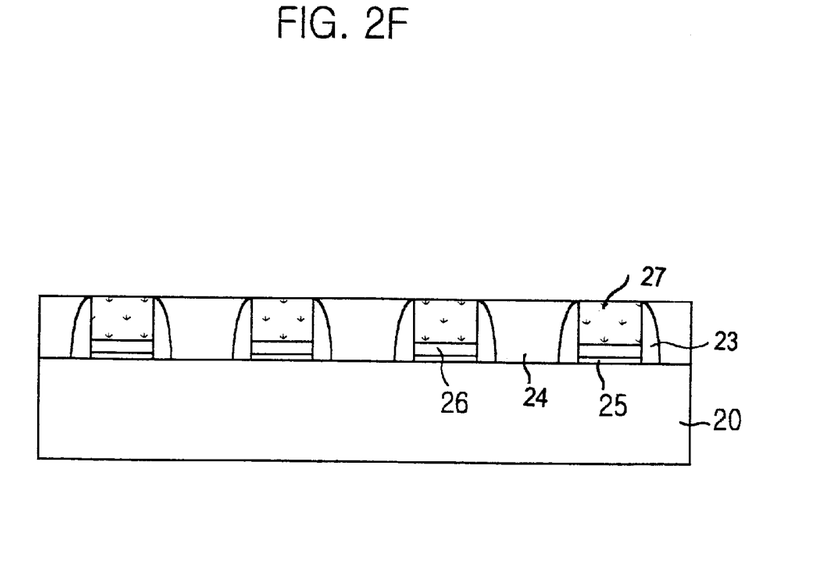

In an ensuing step, as shown in FIG. 2F, a chemical-mechanical polishing process is applied to the metal film 27 to allow the metal film 27 to remain only within the opening is 200. During the polishing, the insulating oxide film 24 is used as a polishing stop layer.

In this case, an abrasive such as at least one of silica and aluminum, and slurry with a hydrogen peroxide having a concentration ranging from 0.5 wt % to 10 wt % may be used.

Figure 2G:
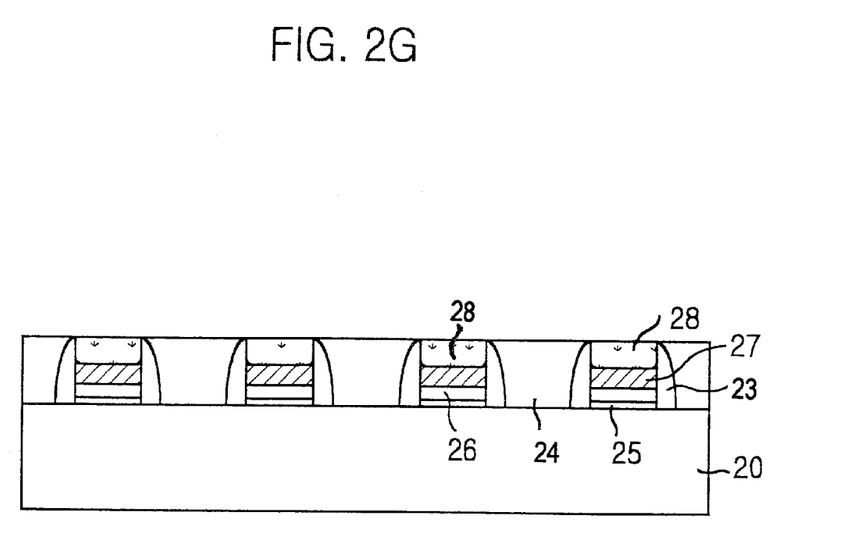

Next, as shown in FIG. 2G, a portion of the metal film 27 formed within the opening 200 is removed by etching, followed by a mask nitride film 28 being deposited on the remaining metal film. Next, a chemical-mechanical polishing process is applied to the mask nitride film 28 until the insulating oxide film 24 is exposed, resulting in the formation of the gate electrode.

The mask nitride film 28 with a thickness ranging from 200 Å to 2000 Å is deposited by the LPCVD or PECVD process, under a temperature ranging from 400° C. to 1300° C. During the polishing of the mask nitride film 28, a hydrogen ion concentration (pH) of the slurry containing an abrasive of $SiO_2$, $CeO_2$, $Al_2O_3$ or $ZrO_2$ series should be maintained in the range of 3 to 12 mol/L.

As demonstrated above, the present invention has the ability to form a gate with a uniform elevation irrespective of a wafer region. Furthermore, even though a chemical-mechanical polishing process using a typical slurry for oxide film polishing is utilized, the present invention has the capability of controlling a polishing selection ratio between an oxide film and a dummy polymer pattern to thereby form a gate (i.e., wordline) with a uniform elevation, resulting in stabilized electrical properties of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for the formation of a gate electrode of a semiconductor device, comprising steps of:

(a) depositing a polymer layer on a semiconductor substrate;

(b) selectively etching the polymer layer to form a patterned polymer;

(c) forming an insulating oxide film for planarization on a structure obtained at said step (b);

(d) applying a chemical-mechanical polishing (CMP) process to the insulating oxide film, with said patterned polymer being used as a polishing stop layer;

(e) removing the patterned polymer to define an opening, a bottom of said opening being defined by an exposed part of the semiconductor substrate;

(f) forming a gate insulating film on the exposed part of the semiconductor substrate within the opening;

(g) depositing an electrically conducting film on a structure obtained at said step (f) to bury the opening;

(h) applying the CMP process to the electrically conducting film to leave the electrically conducting film remaining only within the opening, with said insulating oxide film being used as a polishing stop layer;

(i) removing a portion of the electrically conducting film formed within the opening by etching;

(j) depositing a mask nitride film on a structure obtained at said step (i) to bury the top of the electrically conducting film; and (k) applying the CMP process to the mask nitride film until the insulating oxide film is exposed.

2. The method of claim 1, further comprising after said step (a), steps of:

(a1) applying a baking process to a structure obtained at said step (a); and (a2) applying a curing process to said structure.

3. The method of claim 2, wherein the step (a1) includes the steps of:

(a11) baking the structure at a temperature ranging from 90° C. to 150° C.;

(a12) baking the structure at a temperature ranging from 200° C. to 250° C.; and (a13) baking the structure at a temperature ranging from 300° C. to 350° C.

4. The method of claim 2, wherein the step (a2) is performed in a nitrogen gas ambient and includes steps of:

(a21) curing the structure at a temperature ranging from 400° C. to 500° C.;

(a22) curing the structure at a temperature ranging from 350° C. to 450° C.; and (a23) curing the structure at a temperature ranging from 300° C. to 400° C.

5. The method of claim 1, further comprising after said step (a), a step of forming a hard mask layer including a SiN, $SiO_2$ and SiON on the polymer layer.

6. The method of claim 1, further including after said step (b), a step of forming an insulating film spacer at a sidewall of the patterned polymer, and said step (e) includes defining an opening with a sidewall of said opening exposed to the insulating film spacer and a bottom of said opening exposed to the semiconductor substrate.

7. The method of claim 6, wherein said step (d) of applying the CMP process to the insulating oxide film is performed in a condition that a slurry of $SiO_2$, $CeO_2$, $Al_2O_3$ or $ZrO_2$ series with a size ranging from 10 nm to 500 nm is used, the slurry has a hydrogen ion concentration (pH) ranging from 3 to 12 mol/L, and a concentration of organic material in the slurry is in a range of 0.01 wt % to 5 wt % by weight.

8. The method of claim 7, wherein said step (e) of removing the patterned polymer is performed using a plasma scheme using a mixed gas of $O_2$ and Ar, or $O_2$ and $N_2$, or a wet etching.

9. The method of claim 6, wherein the electrically conducting film includes:

a barrier metal film, formed on the gate insulating film, which is made of one of a Ti, TiN, TiAlN, TiSiN, TaN, WN and $TiSi_2$ material; and a metal film formed on the barrier metal film, which is made of one of tungsten (W) and copper (Cu).

10. The method of claim 9, wherein said step (h) of applying the CMP process to the electrically conducting film is performed using a slurry in which at least one of silica and aluminum and a hydrogen peroxide having a concentration ranging from 0.5 wt % to 10 wt % is included.

11. The method of claim 10, wherein said step (k) of applying the CMP process to the mask nitride film is performed in a condition that a hydrogen ion concentration (pH) of the slurry containing an abrasive of $SiO_2$, $CeO_2$, $Al_2O_3$ or $ZrO_2$ series is in a range of 3 to 12 mol/L.

* * * * *